United States Patent
Shklover et al.

(10) Patent No.: US 9,933,711 B2
(45) Date of Patent: Apr. 3, 2018

(54) OPTICAL ELEMENT

(71) Applicant: Carl Zeiss Laser Optics GmbH, Oberkochen (DE)

(72) Inventors: Vitaliy Shklover, Konigsbronn (DE); Michael Schall, Essingen (DE); Johannes Kraus, Theilheim (DE); Oliver Gloeckl, Aalen (DE); Jeffrey Erxmeyer, Oberkochen (DE); Horst Feldermann, Aalen (DE); Konstantin Forcht, Aalen (DE); Ute Heinemeyer, Neustadt an der Weinstrasse (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 581 days.

(21) Appl. No.: 14/227,352

(22) Filed: Mar. 27, 2014

(65) Prior Publication Data
US 2014/0211181 A1 Jul. 31, 2014

Related U.S. Application Data

(63) Continuation of application No. PCT/EP2012/071275, filed on Oct. 26, 2012.
(Continued)

(30) Foreign Application Priority Data

Oct. 26, 2011 (DE) .................. 10 2011 054 837

(51) Int. Cl.
*G03B 27/54* (2006.01)
*G03F 7/20* (2006.01)
*G02B 1/115* (2015.01)

(52) U.S. Cl.
CPC .......... *G03F 7/70958* (2013.01); *G02B 1/115* (2013.01); *G03F 7/20* (2013.01);
(Continued)

(58) Field of Classification Search
CPC .......... G02B 1/115; G02B 1/10; G02B 17/02; G03F 7/70316; G03F 7/7015;
(Continued)

(56) References Cited

U.S. PATENT DOCUMENTS 4,320,936 A * 3/1982 Sawamura ........... G02B 5/0833
359/359
4,856,019 A 8/1989 Miyata et al.
(Continued)

FOREIGN PATENT DOCUMENTS

DE 100 80 898 6/2001
DE 600 36 185 T2 5/2008
(Continued)

OTHER PUBLICATIONS

International Preliminary Report on Patentability for corresponding PCT Appl. No. PCT/EP2012/071275, dated Apr. 29, 2014.
(Continued)

*Primary Examiner* — Christina Riddle
(74) *Attorney, Agent, or Firm* — Fish & Richardson P.C.

(57) ABSTRACT

In order to make possible both good laser resistance and good antireflection properties, an optical element, in particular for UV lithography, comprising a substrate and a coating on the substrate having at least four layers, is proposed, wherein
a first layer comprising a low refractive index inorganic fluoride compound is arranged on the substrate,
a layer comprising an inorganic oxide-containing compound is arranged as a layer the most distant from the substrate, and
at least two further layers each comprising an inorganic fluoride compound or an inorganic oxide-containing compound are arranged alternately between the first and the most distant layers.

24 Claims, 2 Drawing Sheets

Related U.S. Application Data

Figure 1:
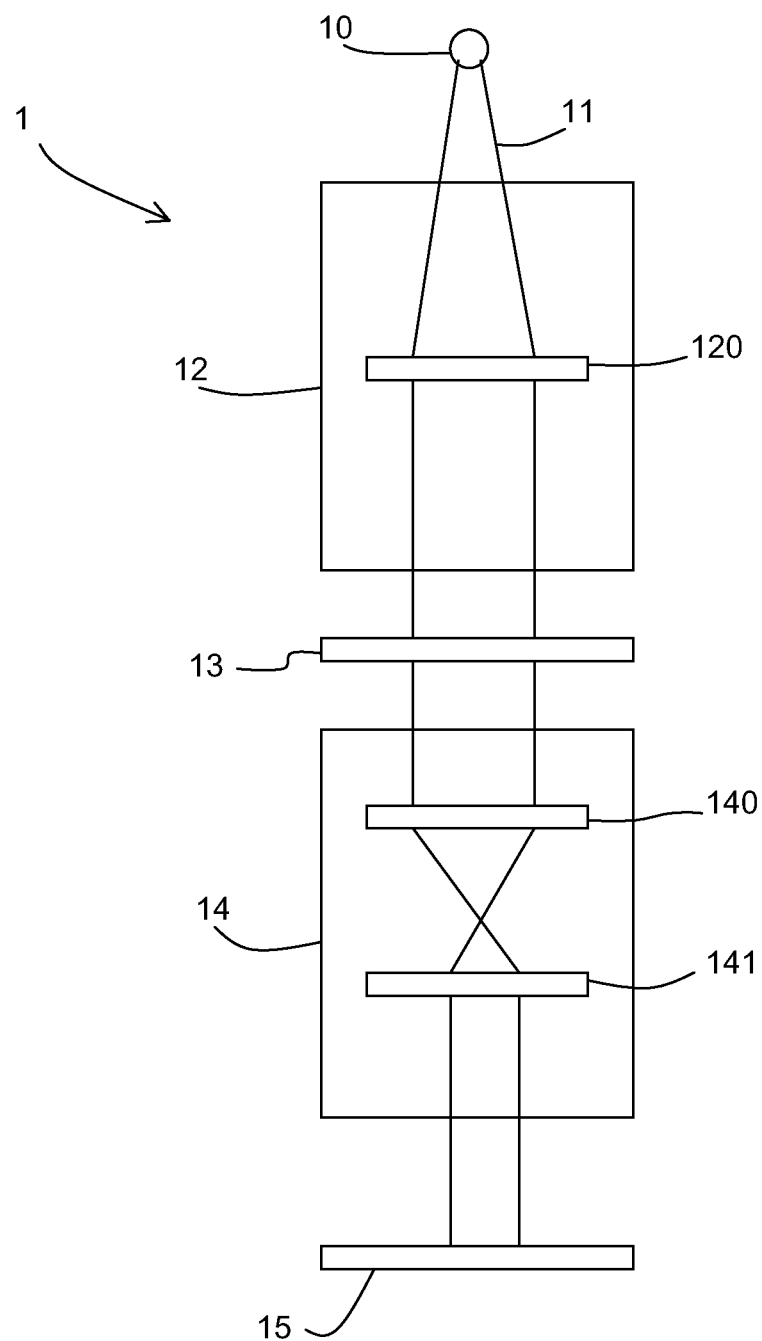

(60) Provisional application No. 61/551,597, filed on Oct. 26, 2011.

(52) U.S. Cl.
CPC ........ *G03F 7/7015* (2013.01); *G03F 7/70191* (2013.01); *G03F 7/70316* (2013.01)

(58) Field of Classification Search
CPC .. G03F 7/70166; G03F 7/702; G03F 7/70191; G03F 7/70233; G03F 7/70958; G03F 7/70225; G03F 7/70241
USPC ............... 355/30, 52, 53, 55, 60, 66–71, 77; 359/884, 850, 350, 355; 250/492.1, 250/492.2, 492.22, 493.1, 503.1, 504 R
See application file for complete search history.

(56) References Cited

U.S. PATENT DOCUMENTS

| | | | |
|---|---|---|---|
| 5,885,712 A * | 3/1999 | Otani | C03C 17/3452 |
| | | | 423/625 |
| 5,993,898 A | 11/1999 | Nagatsuka | |
| 6,030,717 A | 2/2000 | Nakamura et al. | |
| 6,574,039 B1 * | 6/2003 | Murata | B82Y 10/00 |
| | | | 355/67 |
| 6,590,702 B1 | 7/2003 | Shirai | |
| 6,863,965 B2 | 3/2005 | Fujinawa et al. | |
| 6,872,479 B2 | 3/2005 | Maier et al. | |
| 7,128,984 B2 | 10/2006 | Maier et al. | |
| 2001/0003016 A1 | 6/2001 | Pan et al. | |
| 2001/0050762 A1 | 12/2001 | Mulkens et al. | |
| 2002/0105721 A1 * | 8/2002 | Paul | G02B 1/115 |
| | | | 359/359 |
| 2002/0114068 A1 | 8/2002 | Kuschnereit et al. | |
| 2003/0021015 A1 | 1/2003 | Maier et al. | |
| 2005/0179996 A1 | 8/2005 | Weigl et al. | |
| 2005/0225737 A1 | 11/2005 | Weissenrieder et al. | |
| 2007/0000328 A1 | 1/2007 | Buttram | |
| 2009/0128894 A1 * | 5/2009 | Zaczek | G02B 5/0825 |
| | | | 359/359 |
| 2009/0168184 A1 | 7/2009 | Yamada et al. | |
| 2010/0215932 A1 * | 8/2010 | Schreiber | G02B 5/0833 |
| | | | 428/216 |
| 2010/0290021 A1 | 11/2010 | Pazidiz et al. | |

FOREIGN PATENT DOCUMENTS

| | | |
|---|---|---|
| DE | 601 32 355 T2 | 5/2008 |
| EP | 1 152 263 | 11/2001 |
| EP | 1 223 437 | 7/2002 |
| EP | 1 670 038 | 6/2006 |
| JP | 6-250015 A | 9/1994 |
| JP | 11-264903 A | 9/1999 |
| JP | 2002-250801 A | 9/2002 |
| JP | 2005-202375 | 7/2005 |
| JP | 2011-503654 | 1/2011 |
| WO | WO 01/23914 | 4/2001 |

OTHER PUBLICATIONS

International Search Report for corresponding PCT Appl. No. PCT/EP2012/071275, dated Jan. 31, 2013.
Japanese Office Action, with translation thereof, for JP Appl No. 2014-537631, dated May 20, 2016.
German office Action, with translation thereof, for corresponding DE Appl No. 10 2011 054 837.8, dated Jun. 12, 2012.
Japanese Office Action with English translation thereof for corresponding JP Appln. No. 2014-537631, dated Apr. 25, 2017, 9 pages.

* cited by examiner

OPTICAL ELEMENT

CROSS-REFERENCE TO RELATED APPLICATIONS

The present application is a continuation of, and claims benefit under 35 USC 120 to, international application PCT/EP2012/071275, filed Oct. 26, 2012, which claims benefit under 35 USC 119 of German Application No. 10 2011 054 837.8, filed Oct. 26, 2011. International application PCT/EP2012/071275 also claims priority under 35 USC 119(e) to U.S. Provisional Application No. 61/551,597, filed Oct. 26, 2011. The entire disclosure of international application PCT/EP2012/071275 is incorporated by reference herein.

The present invention relates to an optical element, in particular for UV lithography, which comprises a substrate and a coating composed of at least four layers. Furthermore, the invention relates to an optical system and an apparatus for UV lithography comprising such an optical element.

Optical elements in conjunction with lasers as radiation sources are used in many technical fields. Lasers can have a high power density which, under certain circumstances, can result in damage to the optical element. One field of use for optical elements in conjunction with laser radiation sources is lithography on the basis of ultraviolet radiation. Via this method, particularly small structures can be imaged onto objects to be structured. Therefore, this method is used, for example, for producing semiconductor components.

US 2007/000328 A1 discloses optical elements for use with excimer lasers which have a longer lifetime. The optical elements comprise a substrate composed of a metal fluoride, for example composed of magnesium fluoride, barium fluoride or in particular, calcium fluoride. Firstly, one or more layers which can serve for the antireflection coating of the optical element can be arranged on the substrate. A hermetic protective layer composed of aluminum oxide, silicon dioxide or, in particular fluorine-doped silicon dioxide is arranged thereabove. A layer system in which high refractive index and low refractive index metal fluorides are arranged alternatively is proposed as multilayered antireflection coating. For an optical element operated at a wavelength of 193 nm, neodymium fluoride, lanthanum fluoride and gadolinium fluoride are proposed as high refractive index metal fluorides. Magnesium fluoride, aluminum fluoride and barium fluoride are proposed as low refractive index metal fluorides. In this case, the individual layers are arranged in such a way that a high refractive index metal fluoride is arranged directly on the substrate.

Furthermore, EP 1 223 437 A2 discloses an optical component having low reflectance for ultraviolet light from a wavelength range of between approximately 180 nm and approximately 370 nm for a large angle of incidence range, in particular up to at least 40°. The optical component comprises a reflection-reducing multilayer system whose layer adjoining the substrate is substantially free of magnesium fluoride and in which no layer has a layer thickness of more than approximately half the operating wavelength from the ultraviolet wavelength range in which the optical component is used for example in microlithography in conjunction with a laser as radiation source. In preferred embodiments, the layer the most distant from the substrate is composed of magnesium fluoride.

It is an object of the present invention to propose a further optical element which has both a good laser resistance and a good transmission.

This object is achieved via an optical element for UV lithography, comprising a substrate and a coating on the substrate having at least four layers, wherein
- a first layer comprising an inorganic fluoride compound is arranged on the substrate,
- a layer comprising a low refractive index inorganic oxide-containing compound is arranged as the layer the most distant from the substrate, and
- at least two further layers each comprising an inorganic fluoride compound or an inorganic oxide-containing compound are alternately arranged between the first and the most distant layers.

It has been found that, in particular, optical elements which are designed for wavelengths of less than 380 nm, preferably less than 250 nm, particularly preferably less than 200 nm, and in which at least two further layers are arranged between a first layer arranged on the substrate, the first layer being composed of a material comprising an inorganic fluoride compound having a low refractive index at a wavelength in the UV range at which the UV lithography is carried out, and a layer which is terminating toward the surroundings, is the most distant from the substrate and is composed of a material comprising an inorganic oxide-containing compound, the materials of which two further layers likewise comprise an inorganic fluoride compound or an inorganic oxide-containing compound, have a good laser resistance with at the same time good transmission at the UV wavelength for which the optical element is designed. Here fluoridic layers and oxide-containing layers are arranged alternately for the case where there are more than two further layers. This specific coating proposed here simultaneously results in an antireflective effect and a reduction of potential radiation damage as a result of excessively high laser intensities. It should be pointed out that the refractive index of calcium fluoride can be taken as a measure of whether an inorganic fluoride compound has a low refractive index. If the refractive index of the inorganic fluoride compound is less than the refractive index of calcium fluoride at a specific wavelength in the ultraviolet wavelength range, the inorganic fluoride compound has a low refractive index at the wavelength. In the case of the optical elements proposed here, primarily at the wavelength or in the wavelength range for which the optical element is designed it is of relevance whether a material has a low refractive index.

Preferably, the inorganic oxide-containing compound of the layer the most distant from the substrate and/or of one of the at least two further layers has a higher refractive index than the inorganic fluoride compound of the first layer and/or of one of the at least two further layers at a wavelength in the ultraviolet wavelength range. It has been found that an increased transmission can thereby be achieved. Particularly preferably, the inorganic oxide-containing compounds of the layer the most distant from the substrate and of one of the at least two further layers have a higher refractive index than the inorganic fluoride compounds of the first layer and of one of the at least two further layers at a wavelength in the ultraviolet wavelength range.

It is particularly advantageous if the inorganic oxide-containing compound of the layer the most distant from the substrate and/or of one of the at least two further layers has a higher refractive index than calcium fluoride at a wavelength in the ultraviolet wavelength range, in particular if the inorganic oxide-containing compounds of the layer the most distant from the substrate and of one of the at least two further layers have a higher refractive index than calcium fluoride at a wavelength in the ultraviolet wavelength range. A particularly high transmission can thereby be achieved.

Inorganic oxide-containing compounds which have a higher refractive index than calcium fluoride at a wavelength in the ultraviolet wavelength range are also called high refractive index compounds.

Advantageously, the first layer of the coating of the optical element comprises an inorganic metal fluoride in order to increase both the transmission and the laser resistance. Preferably, the first layer consists of aluminum fluoride, magnesium fluoride, lithium fluoride, sodium fluoride, yttrium fluoride, strontium fluoride, barium fluoride or a mixture of two or more of the aforementioned fluorides. In preferred variants, the first layer consists of one of the aforementioned metal fluorides or a mixture of exactly two of the aforementioned metal fluorides. In this case, either metal fluorides having the same valency such as aluminum fluoride and yttrium fluoride or magnesium fluoride, strontium fluoride or barium fluoride or else lithium fluoride and sodium fluoride can in each case be combined with one another. However, it is likewise also possible for two metal fluorides having different valencies to be combined with one another.

Preferably, that layer of the coating of the optical element which is the most distant from the substrate comprises an inorganic oxide, oxyfluoride or oxynitride, as a result of which it is possible to increase the antireflective effect of the coating and the effect thereof affording protection against radiation damage. Oxyfluoride or oxynitride is understood to mean a compound in which the oxide is doped with fluorine or nitrogen. This can also be paraphrased by the respective compound having a portion of $O_xF_y$ or $O_xN_y$, where x and y are in each case between 0 and 1 and in total add up to 1. The radiation resistance can additionally be increased by the doping with fluorine or nitrogen.

In preferred embodiments, that layer of the coating of the optical element which is the most distant from the substrate consists of silicon dioxide, aluminum oxide, fluorine-doped silicon dioxide or nitrogen-doped silicon dioxide or a mixture of two or more of the aforementioned oxide-containing compounds. Optical elements of this type, in conjunction with a long lifetime under laser irradiation, also exhibit very low reflection.

Preferably, the substrate comprises a metal fluoride. Advantageously, the substrate of the optical element consists of magnesium fluoride, strontium fluoride, barium fluoride, lithium fluoride, calcium fluoride or a mixture of two or more of the aforementioned fluorides. Substrates of this type are protected against radiation damage particularly well by the proposed coating.

In preferred embodiments of the optical element, one or more of the at least two further layers is or are composed of the same material as the first layer and/or the most distant layer, i.e. the inorganic fluoride compound of the at least two further layers corresponds to the low refractive index inorganic fluoride compound of the first layer and/or the inorganic oxide-containing compound of the at least two further layers corresponds to the inorganic oxide-containing compound of the layers the most distant from the substrate. Particularly if all further layers are composed of the same materials as the first layer and/or the most distant layer the production process can be made particularly simple and it is nevertheless possible to achieve a good radiation resistance of the coating and thus protection of the substrate against the laser radiation with at the same time high transmission. The fluoridic and oxidic layers can be applied via any known coating methods. They are preferably deposited with plasma or ion assistance. The substrate is advantageously polished before the described coating is applied. All conventional known polishing methods can be used for this purpose. Particular preference is given to polishing methods in which the substrate surface after polishing has as few defects as possible or else as little depth damage as possible, in order to have the lowest possible microroughness which might otherwise lead to scattering losses.

In preferred embodiments, the first layer is arranged directly on the substrate. This allows both high transmission and good laser resistance in conjunction with a construction of the coating of the optical element that is as uncomplicated as possible. Directly should be understood here to the effect that no further optically active layer is provided between first layer and substrate. Depending on the choice of material with regard to the substrate and the first layer it may be necessary to provide an adhesion promoter layer or a pretreatment of the substrate surface in order to enable a sufficient adhesion of the first layer on the substrate.

Preferably, the substrate consists of a crystalline fluoride compound and the first layer is physically and/or chemically vapor deposited (PVD and/or CVD). It has been found that the laser resistance may be substantially enhanced by providing a substrate consisting of a crystalline fluoride compound, on which a first layer comprising a low refractive index inorganic fluoride compound has been physically and/or chemically vapor deposited, in particular by thermal evaporation in vacuum, both through resistively or electron beam heating, sputtering, plasma or photo-enhanced chemical vapor deposition, atomic layer deposition or plasma or photo-enhanced atom layer deposition. It is supposed that lattice defects in the substrate due to laser irradiation might be repaired by fluorine diffusing from the first layer into the underlying substrate, the atoms and ions inside the first layer having a comparatively high mobility due to being vapor deposited. Advantageously, the crystalline substrate consists of calcium fluoride. It has been found that an optical element with a substrate consisting of crystalline calcium fluoride shows a particularly good laser resistance in combination with a vapor deposited first layer on it. Compared with uncoated lenses or lenses with a conventional antireflective coating, life time can be prolonged by ca. 25%.

In further preferred embodiments, an additional layer comprising a high refractive index inorganic oxide-containing compound is arranged between the substrate and the first layer. Both the transmission and the antireflection coating can thereby be improved. In particular, the absorption in the ultraviolet wavelength range can be reduced. Particularly preferably, the additional layer is composed of the same material as the layer most distant from the substrate and/or one of the at least two further layers. The inorganic oxide-containing compound is deemed to have a high refractive index for the wavelength or wavelength range in which the optical element is intended to be used if it has a higher refractive index than calcium fluoride for the wavelength or wavelength range.

Advantageously, the additional layer consists of silicon dioxide, aluminum oxide, fluorine-doped silicon dioxide or nitrogen-doped silicon dioxide or a mixture of two or more of the aforementioned oxide-containing compounds. An additional layer of such a material has been found to particularly decrease the absorption of light in the ultraviolet and deep ultra violet wavelength range as well as the phenomenon of thermal lensing. Preferably the additional layer has a thickness of at least 1 nm, more preferably of at least 3 nm.

Advantageously, the number, the material and the thickness of the at least four layers are chosen in such a way that a maximum transmission is achieved for angles of incidence of between 20° and 40° or between 60° and 80°. In this case, in particular, the thickness of the individual layers can be used to influence the angle of incidence range in which the reflection at the surface of the optical element is best suppressed. Preferably, the thicknesses of the at least two further layers are optimized to that effect, particularly preferably the thicknesses of all at least four layers.

Furthermore, the object is achieved via an optical system for UV lithography comprising at least one optical element proposed here, and via an apparatus for UV lithography comprising at least one optical element proposed here.

Figure 2:
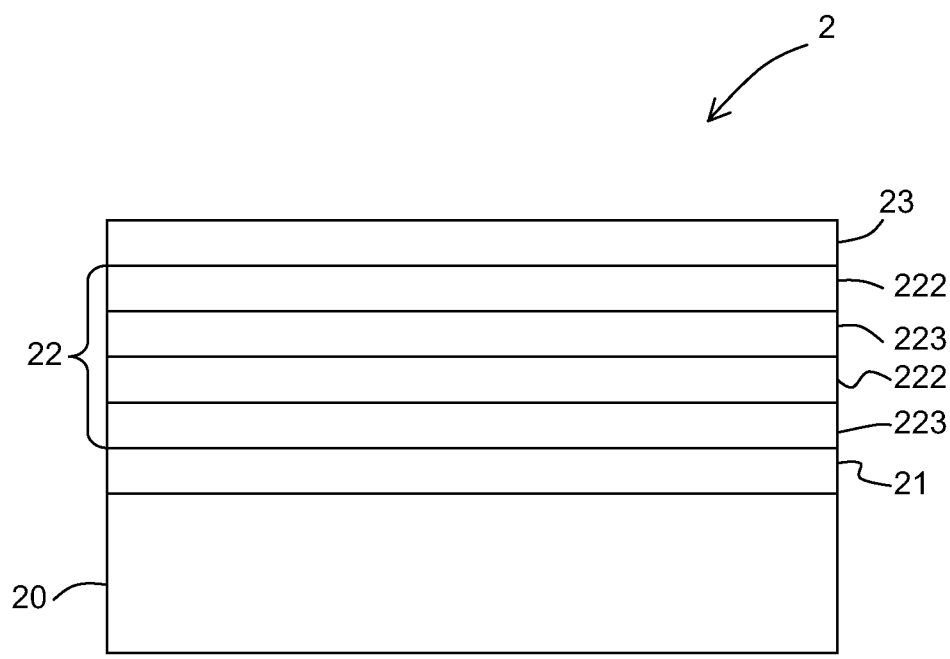
Figure 3:
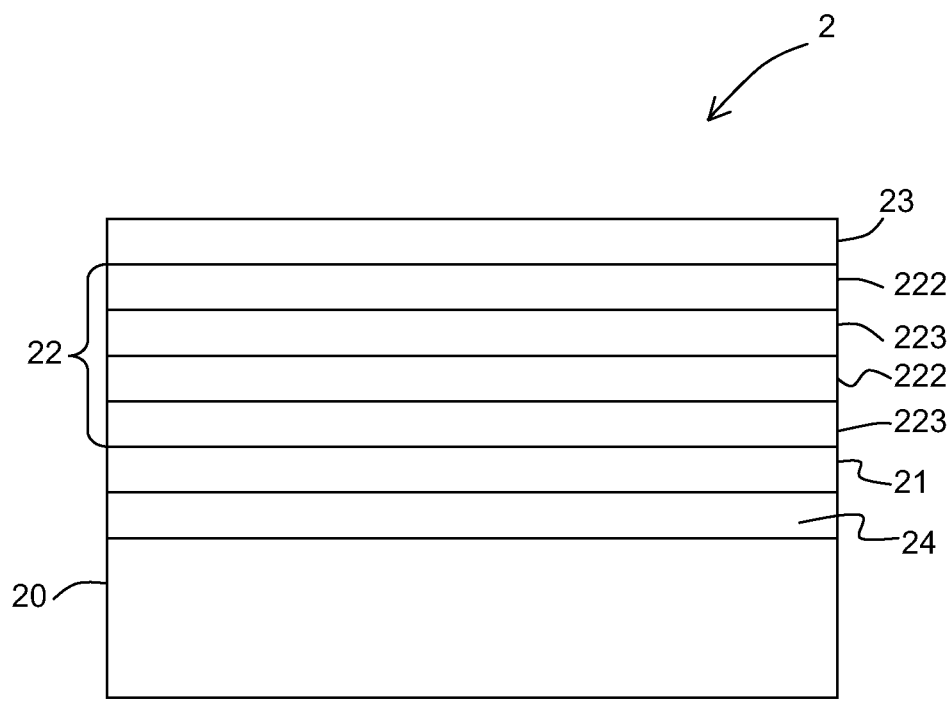

The present invention will be explained in greater detail with reference to a preferred exemplary embodiment. In this respect, FIG. 1 shows a systematic basic schematic diagram of an apparatus for UV lithography;

FIG. 2 schematically shows a first embodiment of an optical element suitable for use in lithography with ultraviolet radiation; and FIG. 3 schematically shows a second embodiment of an optical element suitable for use in lithography with ultraviolet radiation.

FIG. 1 shows a basic schematic diagram of an apparatus 1 for UV lithography. The UV lithography apparatus 1 comprises as essential component parts in particular two optical systems 12, 14, an illumination system 12 and a projection system 14. Carrying out the lithography requires a radiation source 10, particularly preferably an excimer laser, which emits for example at 248 nm, 193 nm or 157 nm and which can be an integral part of the UV lithography apparatus. The radiation 11 emitted by the radiation source 10 is conditioned with the aid of the illumination system 12 such that a mask 13, also called reticle, can thereby be illuminated. For this purpose, the projection system 12 comprises at least one transmissive optical element. The optical element 120 is illustrated here in a representative fashion, this optical element concentrating the radiation 11, for example. In a known manner, in the illumination system 12 a wide variety of transmissive and other optical elements can be combined with one another in an arbitrary, also more complex manner.

The mask 13 has on its surface a structure which is transferred to an element 15 to be exposed, for example a wafer in the context of production of semiconductor components with the aid of the projection system 14. The projection system 14 also comprises at least one transmissive optical element. In the example illustrated here, two transmissive optical elements 140, 141 are illustrated in a representative fashion, which serve, for example, in particular, to reduce the structures on the mask 13 to the size desired for the exposure of the wafer 15. In the exposure system 14, too, a wide variety of optical elements can be arbitrarily combined with one another in a known manner.

The optical elements 120, 140, 141 and also the mask 13 can be an optical element comprising a substrate and a coating on the substrate having at least four layers, wherein a first layer comprising a low refractive index inorganic fluoride compound is arranged on the substrate, a layer comprising an inorganic oxide-containing compound is arranged as a layer the most distant from the substrate, and at least two further layers each comprising an inorganic fluoride compound or an inorganic oxide-containing compound are arranged alternately between the first and the most distant layers. Advantageously, the optical element is optimized for use at, for example, 248 mm, 193 nm or 157 nm—wavelengths at which UV lithography is preferably carried out, wherein high-intensity excimer lasers can be used as a radiation source.

Particularly preferably, optical elements which like the optical element 120 are arranged in the illumination system 12 are embodied as described above, since the radiation intensity is particularly high in particular further upstream in the beam path, i.e. in the vicinity of the laser radiation source, and, therefore, there is a need for high resistance to radiation damage particularly in the case of these optical elements.

The particular construction of the coating of the optical elements described here may be explained in conjunction with FIG. 2, which schematically illustrates an exemplary embodiment of an optical element which is suitable, in particular, for the use of lithography with ultraviolet radiation.

It should be pointed out that only one side of the substrate 20 of the optical element 2 is coated in the example illustrated here. It goes without saying that two opposite sides of the substrate 20 can also be provided with the coating proposed here. Optionally, more than two sides or even the substrate as a whole can also be provided with the coating.

In one preferred exemplary embodiment, the optical element 2 is designed for use in the DUV lithography at a wavelength of 193 nm. For this purpose, the substrate 20 can be composed of magnesium fluoride, strontium fluoride, barium fluoride, lithium fluoride or a fluoride mixture. In the example considered more closely here the substrate 20 is composed of calcium fluoride. The first layer 21 on the substrate 20 is a metal fluoride layer which has a low refractive index at 193 nm and is composed of, for example, aluminum fluoride, lithium fluoride, sodium fluoride, yttrium fluoride, sodium fluoride or strontium fluoride or else a mixture of different low refractive index metal fluorides. In the example considered more closely here, it is a layer composed of magnesium fluoride. If the substrate 20 is likewise composed of a metal fluoride, here of calcium fluoride, for example, the first layer 21 composed here of magnesium fluoride, for example, can be deposited directly on the substrate. In the case of other substrate materials, it may be necessary, under certain circumstances, to provide an adhesion promoter layer or to condition the surface of the substrate in order that the first layer 21 adheres well on the surface of the substrate 20. In principle, however, in the example illustrated in FIG. 2, provision is made for applying the first layer 21 as directly as possible on the surface of the substrate. The deposition of the first layer 21 and also of the succeeding layers 222, 223 is preferably effected with plasma or ion assistance. Particularly when depositing metal fluoride layers, the process is preferably performed with plasma or ion assistance in an atmosphere comprising a fluorine-containing gas or gas mixture.

At least two further layers each comprising an inorganic fluorine compound or an inorganic oxide-containing compound are arranged on the first layer 21. In the example illustrated here, a layer system 22 is arranged which comprises two layers 223 based on an inorganic oxide-containing compound, and two layers 222 based on an inorganic fluoride compound. A layer 23 distant from the substrate and based on an inorganic oxide-containing compound is arranged on the layer system 22 in a terminating fashion with respect to the surroundings of the optical element 2.

All layer thicknesses are preferably approximately one quarter of the wavelengths at which the optical element is intended to be used or the lithography process is carried out, that is to say for example approximately 48 nm. In this case, a layer thickness should be understood to mean an optical thickness defined as a product of refractive index and geometrical layer thickness.

The layer system 22 comprises four layers in the present example. In other variants, it can also comprise more or fewer layers. An even number of layers is preferably involved. It is thereby possible to ensure that over the entire coating composed of first layer 21, layer system 22 and most distant layer 23, an oxide containing layer always follows a fluoride containing layer, and vice versa. As a result, both the resistance to radiation damage and the antireflective effect can be optimized particularly well.

Both the most distant layer 23 and the oxidic layers 223 of the layer system 22 preferably consist of aluminum oxide, silicon dioxide, fluorine-doped silicon dioxide or nitrogen-doped silicon oxide. In the preferred exemplary embodiment considered more closely here, silicon dioxide is involved. Moreover in the preferred exemplary embodiment considered here, the material of the fluoride layers 222 of the layer system 22 also corresponds to the material of the low refractive index first layer 21 composed of magnesium fluoride.

In a variant of the preferred exemplary embodiment considered more closely here, the substrate 20 consists of crystalline calcium fluoride and the first layer 21 of magnesium fluoride is physically and/or chemically vapor deposited, in particular by thermal evaporation in vacuum, both through resistively or electron beam heating, sputtering, plasma or photo-enhanced chemical vapor deposition, atomic layer deposition or plasma or photo-enhanced atom layer deposition. In one of several preferred variant, thermal evaporation in vacuum is used. Due to vapor deposition, the fluorine inside the magnesium fluoride layer 21 can easily diffuse into the crystalline substrate 20 to places where lattice defects in form of e.g. lattice vacancies have been caused by laser irradiation and fill up the vacancies. Thus, this variant shows an ability of self-repair leading to an enhanced laser resistance.

A further exemplary embodiment of an optical element 2 is illustrated in FIG. 3. It differs from the exemplary embodiment illustrated in FIG. 2 to the effect that an additional layer 24 composed of a high refractive index inorganic oxide-containing compound is arranged between the substrate 20 and the first layer 21 composed of a low refractive index inorganic fluoride compound. In this case, the same materials can be selected as in the case of the exemplary embodiment illustrated in FIG. 2. Compared with the exemplary embodiment illustrated in FIG. 2, the exemplary embodiment illustrated in FIG. 3 with the additional layer 24 has a higher transmission and greater antireflection under the same use conditions, with the result that such optical elements 2 are particularly well suited to use in optical systems and apparatuses for UV lithography. In particular, the embodiment according to FIG. 3 shows a lower absorption under the same use conditions.

In a preferred variant of the further exemplary embodiment, the additional layer 24 consists of silicon dioxide, aluminum oxide, fluorine-doped silicon dioxide or nitrogen-doped silicon dioxide or a mixture of two or more of the aforementioned oxide-containing compounds. In some preferred variants, the additional layer 24 consists of silicon dioxide, aluminum oxide or a mixture of both. Advantageously, the additional layer 24 has a thickness of at least 1 nm, preferably 3 nm. E.g. at a wavelength of 193 nm, such an optical element can have an absorption reduced by ca. 25% and can show a significantly reduced thermal lensing, when irradiated by a laser emitting at 193 nm.

Through variations of, in particular, the layer thicknesses it is possible to influence the angle of incidence range in which a particularly low reflection at the surface of the optical element 2 is caused by coating, and thus a particularly high transmission. In the preferred exemplary embodiments considered more closely here, the thicknesses are chosen in a first variant in such a way that the transmission is the highest at an angle of incidence in the range of 20° and 40°, the angle of incidence being measured with respect to the surface normal. In a further variant, the maximum transmission is in an angle of incidence range of 60° and 80°. The concrete individual layer thicknesses can be determined by simulation calculations in a known manner. As a result of the high transmission in these higher angle of incidence ranges, this embodiment of the optical element is particularly well suited to use in illumination systems or projection systems for UV lithography which are of complex construction and which also have to employ higher angle of incidence ranges for space reasons. Preferably, the optical element in the embodiments illustrated here is designed to have a maximum transmission over a widest possible angle of incidence range of between 20° and 40° or 60° and 80°.

The exemplary embodiments discussed here are distinguished, moreover, by a high resistance to irradiation with lasers in the ultraviolet wavelength range even at relatively high radiation power, as a result of which they are additionally particularly suitable for use in optical systems and apparatuses for lithography in the ultraviolet range, in particular in the deep ultraviolet wavelength range at wavelengths of less than 300 nm. In addition to the high resistance to irradiation with lasers in the ultraviolet wavelength range, the embodiments show a particularly low reflectivity. The embodiments according to FIG. 3 also show a particularly low absorption in the ultraviolet wavelength range.

The invention claimed is:

1. An optical element, comprising:
   a substrate comprising a fluoride; and
   a coating supported by the substrate,
   wherein:
   the coating comprises, in order moving away from the substrate, a first layer, a second layer, a third layer, a fourth layer, and a fifth layer;
   the first layer comprises an inorganic oxide;
   the coating does not include two consecutive oxide layers;
   the second layer comprises an inorganic fluoride having a refractive index at a wavelength in the ultraviolet range that is less than a refractive index of calcium fluoride at the wavelength in the ultraviolet range;
   the third layer comprises the inorganic oxide;
   the fourth layer comprises an inorganic fluoride;
   the fifth layer comprises the inorganic oxide;
   the first layer is in contact with the substrate;
   the fifth layer is in contact with the surroundings of the optical element;
   the second layer is in direct contact with the first layer; and
   the second layer is in direct contact with the third layer.

2. The optical element of claim 1, wherein the inorganic oxide of the fifth layer has a refractive index at the wavelength in the ultraviolet wavelength range that is greater than the refractive index of the inorganic fluoride of the second layer at the wavelength in the ultraviolet range.

3. The optical element of claim 2, wherein the inorganic oxide of the fifth layer has a refractive index at the wavelength in the ultraviolet range that is greater than a refractive index of the inorganic fluoride of the fourth layer at the wavelength in the ultraviolet range.

4. The optical element of claim 1, wherein the inorganic oxide of the third layer has a refractive index at the wavelength in the ultraviolet range that is greater than the refractive index of the inorganic fluoride of the second layer at the wavelength in the ultraviolet range.

5. The optical element of claim 1, wherein the inorganic oxide of the fifth layer has a refractive index at the wavelength in the ultraviolet range that is greater than the refractive index of calcium fluoride at the wavelength in the ultraviolet range.

6. The optical element of claim 5, wherein the inorganic oxide of the third layer has a refractive index at the wavelength in the ultraviolet range that is greater than the refractive index of calcium fluoride at the wavelength in the ultraviolet range.

7. The optical element of claim 1, wherein the inorganic oxide of the third layer has a refractive index at the wavelength in the ultraviolet range that is greater than the refractive index of calcium fluoride at the wavelength in the ultraviolet range.

8. The optical element of claim 1, wherein the inorganic fluoride of the second layer comprises an inorganic metal fluoride.

9. The optical element of claim 1, wherein the inorganic fluoride of the second layer comprises at least one material selected from the group consisting of aluminum fluoride, magnesium fluoride, lithium fluoride, sodium fluoride, yttrium fluoride, strontium fluoride, and barium fluoride.

10. The optical element of claim 1, wherein the inorganic oxide of the fifth layer comprises at least one material selected from the group consisting of an oxyfluoride and an oxynitride.

11. The optical element of claim 1, wherein the inorganic oxide of the fifth layer comprises at least one material selected from the group consisting of silicon dioxide, aluminum oxide, fluorine-doped silicon dioxide, and nitrogen-doped silicon dioxide.

12. The optical element of claim 1, wherein the substrate comprises a metal fluoride.

13. The optical element of claim 1, wherein the substrate comprises at least one material selected from the group consisting of magnesium fluoride, strontium fluoride, barium fluoride, lithium fluoride, and calcium fluoride.

14. The optical element of claim 1, wherein the inorganic fluoride of the second layer is the same as the inorganic fluoride of the fourth layer.

15. The optical element of claim 1, wherein the first layer comprises an inorganic oxide having a refractive index at the wavelength in the ultraviolet range that is higher than the refractive index of the inorganic fluoride of the second layer at the wavelength in the ultraviolet range.

16. The optical element of claim 1, wherein the first layer comprises at least one material selected from the group consisting of silicon dioxide, aluminum oxide, fluorine-doped silicon dioxide, and nitrogen-doped silicon dioxide.

17. The optical element of claim 1, wherein the coating is configured so that, when exposed to ultraviolet radiation, a maximum transmission is achieved at angles of incidence between 20° and 40°.

18. The optical element of claim 1, wherein the coating is configured so that, when exposed to ultraviolet radiation, a maximum transmission is achieved at angles of incidence between 60° and 80°.

19. A system, comprising:
an optical element according to claim 1,
wherein the system is selected from the group consisting of an ultraviolet lithography illumination system and an ultraviolet projection system.

20. An apparatus, comprising:
an illumination system; and
a projection system,
wherein the apparatus is an ultraviolet lithography apparatus, a system comprises an optical element according to claim 1, and the system is selected from the group consisting of the illumination system and the projection system.

21. The optical element of claim 1, wherein the fourth layer is in direct contact with the third layer, and the fourth layer is in direct contact with the fifth layer.

22. An optical element, comprising:
a substrate comprising a fluoride; and
a coating supported by the substrate,
wherein:
    the coating comprises an inner most layer, an outer most layer, and a multi-layer stack between the inner most layer and the outer most layer;
    the inner most layer is the layer of the coating that is closest to the substrate;
    the outer most layer is the layer of the coating that is furthest from the substrate;
    the inner most layer comprises an inorganic oxide;
    the outer most layer comprises the inorganic oxide;
    the multi-layer stack comprises alternating layers of an inorganic fluoride and the inorganic oxide;
    the inner most layer is in contact with the substrate;
    the outer most layer is in contact with the surroundings of the optical element; and
    the alternating layers of an inorganic fluoride and the inorganic oxide are in contact with each other.

23. An optical element, comprising:
a substrate comprising a fluoride; and
a coating supported by the substrate,
wherein:
    the coating comprises at least five layers;
    the at least five layers comprise alternating layers of the same inorganic oxide and the same inorganic fluoride;
    the layer of the coating that is closest to the substrate comprises the inorganic oxide;
    the layer of the coating that is furthest from the substrate comprises the inorganic oxide;
    a refractive index of the inorganic oxide at a wavelength in the ultraviolet range is greater than a refractive index of the inorganic fluoride at the wavelength in the ultraviolet range;
    the layer of the coating that is closest to the substrate is in contact with the substrate;
    the layer of the coating that is furthest from the substrate is in contact with the surroundings of the optical element; and
    the alternating layers of the same inorganic oxide and the same inorganic fluoride are in contact with each other.

24. An optical element, comprising:
a substrate comprising a fluoride; and
a coating supported by the substrate,
wherein:
    the coating comprises, in order moving away from the substrate, a first layer, a second layer, a third layer, a fourth layer, and a fifth layer;
    the first layer comprises an inorganic oxide;

the coating does not include two consecutive oxide layers;
the second layer comprises an inorganic fluoride having a refractive index at a wavelength in the ultraviolet range that is less than a refractive index of calcium fluoride at the wavelength in the ultraviolet range;
the third layer comprises the inorganic oxide;
the fourth layer comprises an inorganic fluoride;
the fifth layer comprises the inorganic oxide;
the first layer is in contact with the substrate;
the fifth layer is in contact with the surroundings of the optical element;
the fourth layer is in direct contact with the third layer; and
the fourth layer is in direct contact with the fifth layer.

* * * * *